(12) United States Patent
Ando et al.

(10) Patent No.: US 7,229,532 B2
(45) Date of Patent: Jun. 12, 2007

(54) SPUTTERING APPARATUS

(75) Inventors: Kenji Ando, Kanagawa (JP); Hidehiro Kanazawa, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 63 days.

(21) Appl. No.: 10/795,315

(22) Filed: Mar. 9, 2004

(65) Prior Publication Data

US 2004/0216992 A1  Nov. 4, 2004

(30) Foreign Application Priority Data

Mar. 10, 2003 (JP) .............................. 2003-064209

(51) Int. Cl.
C23C 14/35 (2006.01)

(52) U.S. Cl. .............................. 204/192.12; 204/192.11; 204/298.04; 204/298.11; 204/298.23; 204/298.27; 204/298.28; 204/298.29

(58) Field of Classification Search .......... 204/298.04, 204/298.11, 298.23, 298.27, 298.28, 298.29, 204/192.11, 192.12
See application file for complete search history.

(56) References Cited

U.S. PATENT DOCUMENTS

| 4,664,935 | A | * | 5/1987 | Strahl | ...................... 204/192.1 |
| 6,010,600 | A | | 1/2000 | Vernon et al. | ......... 204/192.11 |
| 6,238,531 | B1 | * | 5/2001 | Pinarbasi | ............... 204/298.04 |

FOREIGN PATENT DOCUMENTS

| JP | 63-266061 | * | 11/1988 |
| JP | 07-150347 | * | 6/1995 |
| JP | 09-040441 | * | 2/1997 |
| JP | 09-213634 | | 8/1997 |
| JP | 10-30170 | | 2/1998 |

OTHER PUBLICATIONS

Machine Translation of Japanese 09-040441 dated Feb. 1997.*

* cited by examiner

*Primary Examiner*—Rodney G. McDonald
(74) *Attorney, Agent, or Firm*—Fitzpatrick, Cella, Harper & Scinto

(57) ABSTRACT

A sputtering apparatus for forming a film by a physical gas-phase growth on a substrate having a irregular or flat shape is provided including three or more axes for independently varying a relative positional relationship between a substrate and a cathode in the course of film formation.

8 Claims, 9 Drawing Sheets

FILM THICKNESS DISTRIBUTION IN A PRIOR METHOD

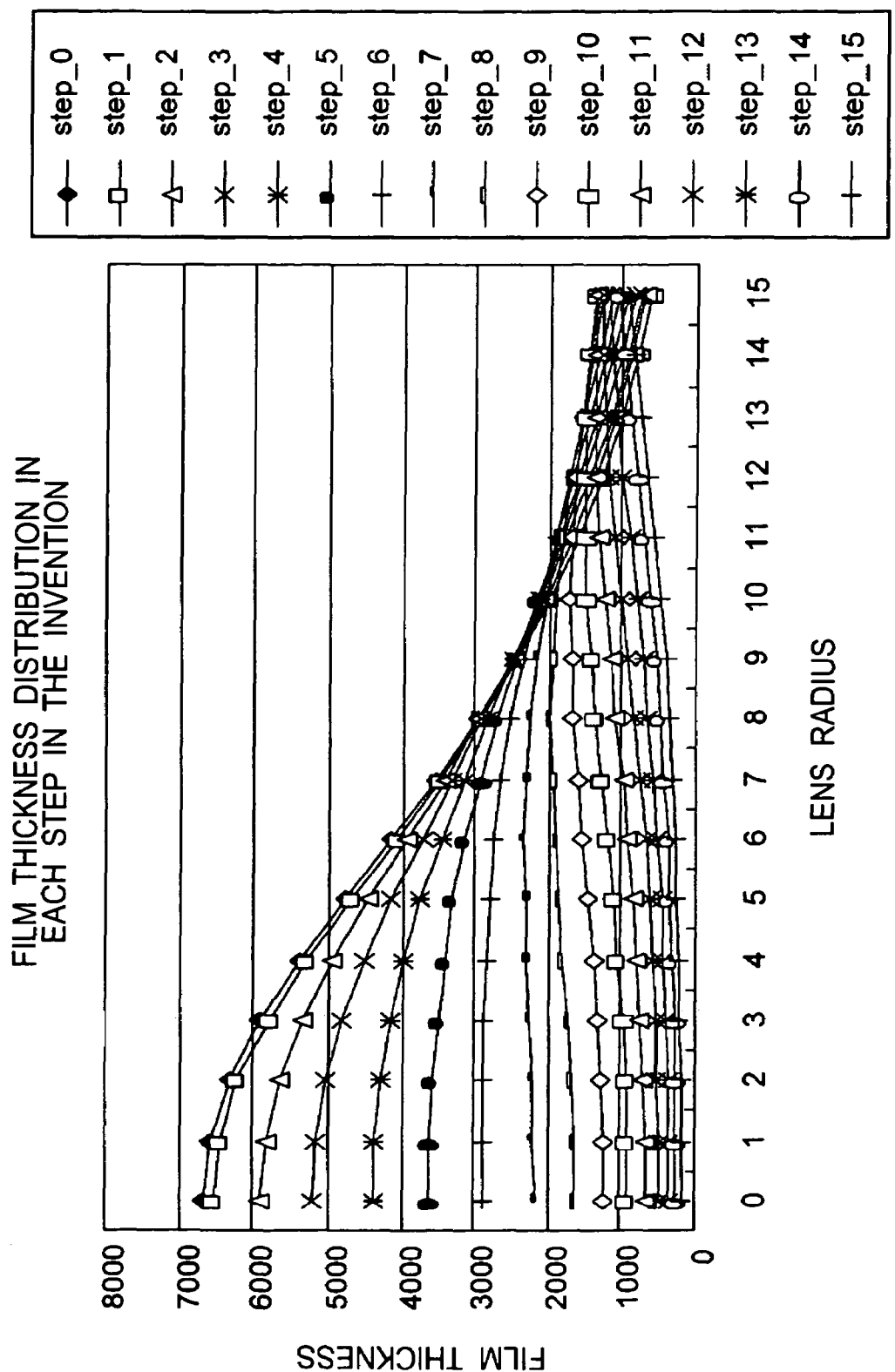

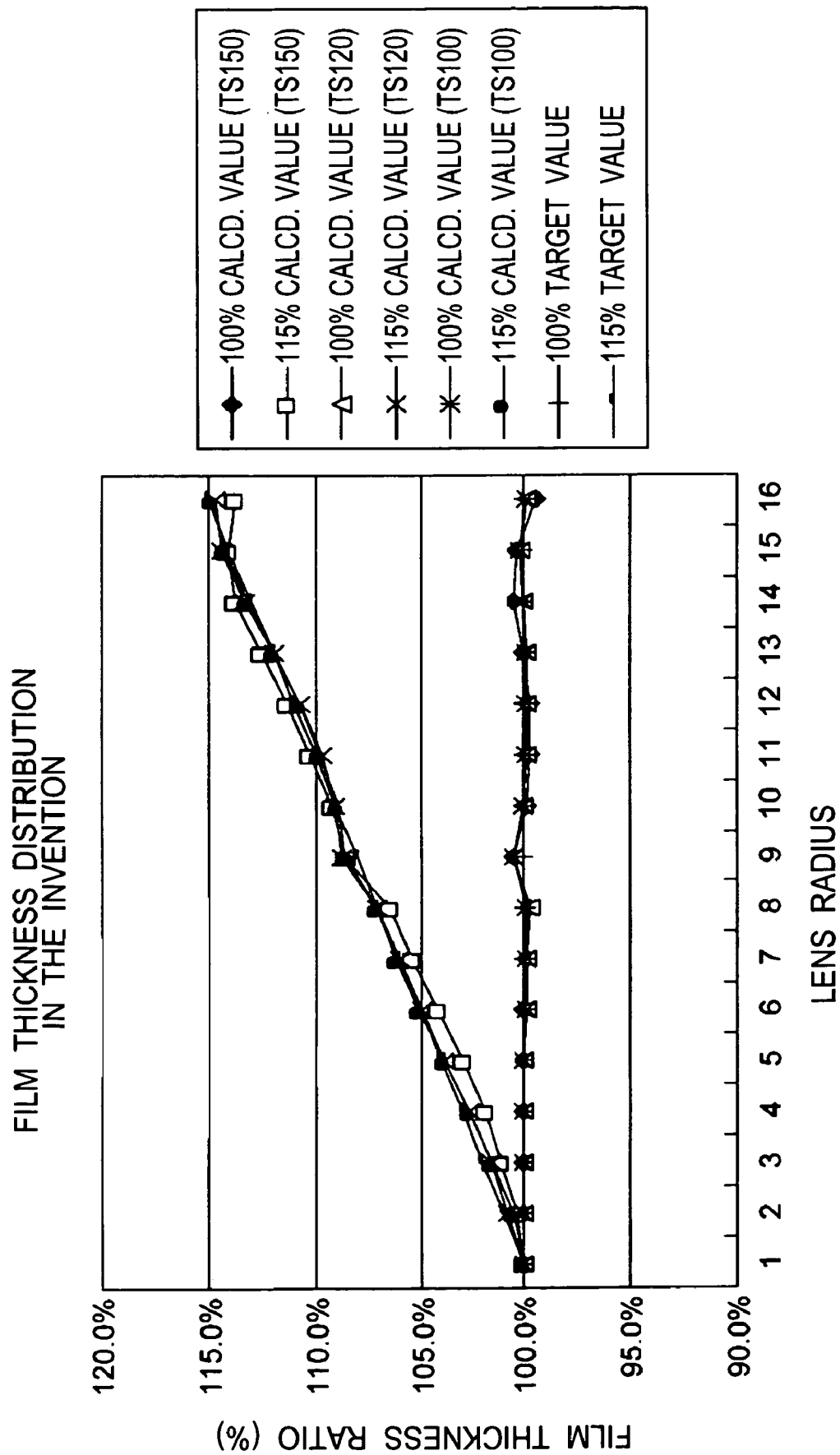

FIG. 7

STAY TIME RATIO IN EACH STEP

| STEP No. | PRIOR METHOD 100% TARGET | | | PRIOR METHOD 115% TARGET | | | METHOD OF INVENTION 100% TARGET | | | METHOD OF INVENTION 115% TARGET | | |
|---|---|---|---|---|---|---|---|---|---|---|---|---|
| | TS_150 | TS_120 | TS_100 | TS_150 | TS_120 | TS_100 | TS_150 | TS_120 | TS_100 | TS_150 | TS_120 | TS_100 |
| 0 | 4.7% | 0.0% | 0.0% | 2.6% | 0.0% | 0.0% | 0.5% | 2.1% | 4.5% | 0.0% | 0.0% | 0.0% |
| 1 | 0.0% | 0.0% | 0.0% | 0.0% | 0.0% | 0.0% | 1.9% | 2.5% | 0.0% | 0.0% | 0.0% | 0.0% |
| 2 | 0.0% | 0.0% | 0.0% | 0.0% | 0.0% | 0.0% | 0.0% | 0.0% | 0.0% | 0.0% | 0.0% | 0.0% |
| 3 | 0.0% | 0.0% | 0.0% | 0.0% | 0.0% | 0.0% | 0.0% | 0.0% | 0.0% | 0.0% | 0.8% | 0.0% |
| 4 | 0.0% | 1.6% | 0.0% | 0.0% | 6.1% | 1.7% | 0.0% | 0.0% | 0.0% | 0.0% | 5.2% | 9.8% |
| 5 | 0.0% | 8.3% | 10.5% | 0.0% | 0.0% | 10.5% | 2.8% | 9.0% | 1.5% | 0.0% | 0.0% | 0.0% |
| 6 | 0.0% | 0.0% | 0.8% | 0.0% | 2.7% | 0.0% | 8.1% | 0.0% | 9.6% | 16.9% | 0.0% | 0.0% |
| 7 | 0.0% | 0.0% | 0.0% | 0.0% | 0.0% | 0.0% | 12.5% | 12.7% | 3.2% | 0.0% | 0.0% | 15.3% |
| 8 | 0.0% | 0.0% | 3.5% | 0.0% | 0.0% | 0.0% | 0.0% | 9.9% | 10.5% | 7.6% | 21.2% | 0.0% |
| 9 | 0.0% | 0.0% | 0.0% | 0.0% | 0.0% | 0.0% | 0.0% | 0.0% | 7.3% | 0.0% | 0.0% | 0.0% |
| 10 | 0.0% | 0.0% | 0.0% | 0.0% | 0.0% | 0.0% | 0.0% | 0.0% | 0.0% | 0.0% | 0.0% | 0.0% |
| 11 | 0.0% | 0.0% | 0.0% | 0.0% | 0.0% | 0.0% | 0.0% | 0.0% | 0.1% | 0.0% | 0.0% | 12.9% |
| 12 | 0.0% | 0.0% | 0.0% | 0.0% | 0.0% | 0.0% | 0.0% | 0.0% | 5.6% | 0.0% | 0.0% | 0.0% |
| 13 | 0.0% | 0.0% | 0.0% | 0.0% | 0.0% | 0.0% | 0.0% | 0.0% | 9.3% | 0.0% | 0.1% | 17.1% |
| 14 | 0.0% | 0.0% | 0.0% | 0.0% | 0.0% | 0.0% | 0.0% | 0.0% | 19.1% | 0.0% | 10.1% | 0.0% |
| 15 | 95.3% | 90.0% | 85.2% | 97.4% | 91.2% | 87.8% | 74.1% | 63.7% | 29.3% | 75.5% | 22.7% | 0.0% |
| | | | | | | | | | | | 40.1% | 44.8% |

SPUTTERING APPARATUS

BACKGROUND OF THE INVENTION

1. Field of the Invention

The present invention relates to a sputtering apparatus and a sputtering method for obtaining a uniform film and desired film thickness characteristics in a film formation on a substrate with surface irregularities, mounted on a substrate holder, and more particularly to a film forming apparatus and a film forming method for forming a uniform film with a desired film thickness distribution such as a multi-layered antireflection film or a multi-layered film mirror or an X-ray reflecting multi-layered film, on a substrate such as a large-aperture lens.

2. Description of the Related Art

A magnetron sputtering apparatus of parallel flat plate type, employed already widely, is an apparatus in which a target constituting a material of a thin film and a substrate mounted on a substrate holder are positioned in a mutually opposed manner in a vacuum chamber, and a plasma is generated to sputter the target whereby particles sputtered out are deposited on the substrate to form a thin film thereon, and has features simpler than other methods and capable of a high-speed film formation, a large-area film formation and a longer target life.

In relation to such sputtering apparatus, a sputtering in the field of optical films has been recently investigated, and, particularly in a semiconductor exposure apparatus such as a stepper, together with an improvement toward a higher NA for improving the exposure performance, there are requested an increase in the lens aperture, an improvement in inclined incident characteristics for a ray entering the lens, and, an inclined film of a large diameter and a high precision (for improving the inclined incident characteristics) in an X-ray (EUV) exposure apparatus of next generation.

In a multi-layered X-ray mirror of molybdenum (Mo) and silicon (Si) for an X-ray wavelength of 13.4 nm, the reflection characteristics are lowered depending on an incident angle of the incident X-ray entering the mirror surface, because of an extremely narrow bandwidth of the reflection characteristics. As a countermeasure, a method of forming reflecting mirror characteristics, matching the incident X-ray angle within the plane of the X-ray mirror, is being adopted. It is therefore necessary to highly precisely control the film thickness distribution of molybdenum (Mo) and silicon (Si) within the mirror plane.

For controlling the film thickness distribution, Japanese Patent Application Laid-open No. H10-30170 discloses a method of employing a shield mask and controlling a shape of such shield mask and a moving speed distribution thereof, thereby controlling the film thickness distribution.

Also Japanese Patent Application Laid-open No. H9-213634 discloses a method of film formation under a movement of the substrate in an X or XY direction parallel to an evaporation source.

Also U.S. Pat. No. 6,010,600 proposes an inclined film formation by a revolution speed control when a substrate, executing a revolving motion and a rotating motion, passes over a target.

However, optical elements employed in an exposure apparatus, etc. are designed for increasingly shorter wavelengths and in various shapes such as an aspherical surface, an arbitrarily curved surface and a parabolic surface. For this reason, a film thickness control of a higher precision than in the prior technology is being requested.

For realizing an optical element requiring such highly precise film thickness control, the following film forming apparatus and film forming method are indispensable:

(1) Ability for film thickness distribution control for various irregular shapes;
(2) Adaptability to plural targets (showing different film thickness distributions by a difference in an emission angle distribution of a material);
(3) A film formed by an inclined entry of sputtering particles has a low film density, thus showing a change in the refractive index and a change in the optical characteristics by a moisture adsorption. Therefore the film forming apparatus should minimize an inclined entry component of the sputtering particles;
(4) A load lock type film formation should be possible in order to minimize particle generation, and influence of residual gas, particularly water;
(5) The film forming apparatus should not introduce a complex moving mechanism into the vacuum chamber.

In the aforementioned method of employing a shield mask and controlling the shape of the shield mask and a moving speed distribution thereof, thereby controlling the film thickness distribution (Japanese Patent Application Laid-Open No. H10-30170), it is difficult to meet the above requirements (1) and (2) with a mask of a single shape, there is required an operation of replacing the mask by opening the vacuum chamber to the air. The opening of the vacuum chamber to the air causes water in the air to be adsorbed in a film deposited in the vacuum chamber, thereby increasing a stress in the film and inducing a peeling thereof, thus resulting in an influence corresponding to (4). Also the shield mask, positioned in the vicinity of the substrate between the target and the substrate, undesirably becomes a source of particles.

The method of employing a shield mask and controlling the shape of the shield mask and a moving speed distribution thereof, thereby controlling the film thickness distribution, as disclosed in Japanese Patent Application Laid-open No. H10-30170, can only deposit a rotationally symmetrical film but cannot be adapted to a film of other configurations.

The inclined film formation by a revolution speed control when a revolving and rotating substrate passes over a target, as proposed in U.S. Pat. No. 6,010,600, can only deposit a rotationally symmetrical film.

The method of film formation under a movement of the substrate in an X or XY direction parallel to an evaporation source, disclosed in Japanese Patent Application Laid-open No. H9-213634, in a film formation of a peripheral portion of a substrate having a large curvature in an irregularity and/or a complex shape, brings about a large inclined entry component of the sputtering particles entering the substrate, thereby resulting in a film of a low film density and causing a shift in the characteristics. Further, a complex moving mechanism is undesirably required in the vacuum apparatus.

SUMMARY OF THE INVENTION

An object of the present invention is to obtain a uniform and highly precise optical thin film with a desired film thickness distribution on a substrate of various shapes.

The aforementioned object can be attained by a sputtering apparatus for forming a film by a physical gas-phase growth on a substrate having a irregular or flat shape, including three or more axes for independently varying a relative positional relationship between a substrate and a cathode in the course of film formation.

According to the present invention, there is also provided a film forming method by sputtering, characterized in that, in the aforementioned sputtering apparatus, a film formation is executed by a scan or plural scans with a moving speed under plural controlled conditions of at least two axes among the cathode rotating axis, the substrate rotating axis, the scan axis and the TS control axis.

According to the present invention, there is also provided a film forming method by sputtering, characterized in that, in the aforementioned sputtering apparatus, a film formation is executed by a scan or plural scans with a moving speed under plural controlled conditions of at least two axes among the cathode rotating axis, the substrate rotating axis, the scan axis and the TS control axis.

According to the present invention, there is also provided a sputtering apparatus for forming a film by a physical gas-phase growth on a substrate having an arbitrary curved surface shape, comprising three or more axes for independently varying a relative positional relationship between a substrate and a cathode in the course of film formation, and at least a function, independently of the control axis for the positional relationship, of varying a rate and/or a film forming area in the course of film formation.

In a configuration of the present invention (represented in an XYZ coordinate system), a cathode rotary axis for one or plural cathodes has a scanning axis having a rotation center on an X'-axis offset to a Z-axis on a Y-axis parallel to a target surface and executing a scanning motion on an XZ plane, a rotary axis for rotating a substrate incorporated in a unit moving on the XZ plane by the scanning axis, and a TS control axis for varying a target-substrate distance. When taking as an example a situation where a substrate with a irregular surface is set on a substrate holder, for example a convex lens of an external diameter of 300 mm and a radius of curvature of R=300 mm is set on the rotating substrate holder, in any film forming area of a radius of the rotating lens on the XZ plane and at the side of the target, a normal to the lens is made substantially perpendicular to a film forming face of the target by angles of two axes, namely a cathode rotation angle (Tθ) and an angle (Sθ) of the scanning axis having the rotation center on the X'-axis offset to the Z-axis and executing a scanning motion on the XZ plane.

In this manner it is possible to obtain a film rich in a perpendicular entry component of the sputtering particles and having a desired film thickness distribution, by setting plural conditions in which the target and the film forming area in the lens are mutually opposed and by executing a film formation in a single scan or plural scans under a control of a stay time in such conditions. A similar effect can also be obtained by continuously varying such plural conditions and executing a single scan or plural scans under a control of varying speeds of such two axes.

Further, it is more preferable to add a TS control axis capable of a target-substrate distance and to execute the aforementioned scanned film formation under a control to maintain a constant distance between the target and the lens, whereby a control of the film thickness distribution is rendered possible while obtaining a uniform film under a constant film forming condition.

(These actions have been explained in the case of a convex lens, but a similar effect can be obtained also in case of a change in the emission angle distribution of the sputtering particles, for example; in a concave lens or when the target is changed to a different material, by optimizing the cathode rotation angle (Tθ), the scan axis angle (Sθ) and the distance between the target and the substrate.)

The above-described configuration necessitates somewhat complex motions in a vacuum environment of a film forming chamber in a sputtering apparatus provided with a load lock chamber, but, in the present invention, a highly reliable mechanism with little possibility of leakage can be relatively easily realized by constituting the target rotating axis and the substrate rotating axis by rotary axes utilizing a magnetic seal, also the scan axis by a system of covering a central rotating portion with bellows and the TS axis for varying the target-substrate distance by a moving mechanism utilizing bellows.

Therefore, in the prior technologies of a mask moving method or a method of moving the substrate parallel to the X, Y-axes, a film formation on a substrate with surface irregularities results in a formation of a low density film, having a large inclined entry component of the sputtering particles in a peripheral portion of the lens, but the sputtering apparatus of the present invention can obtain a uniform and highly precise film on the entire lens with a desired film thickness distribution, even in the presence of a change in the emission angle distribution by the target material or in the profile (irregularities) of the substrate, by optimizing the cathode rotation angle (Tθ), the scan axis angle (Sθ) and the target-substrate distance condition.

BRIEF DESCRIPTION OF THE DRAWINGS

FIG. 5 is a chart showing a film thickness distribution (a convex lens, ø300, radius of curvature 300) in each step of a method of the present invention;

FIG. 6 is a chart showing a film thickness distribution (a convex lens, ø300, radius of curvature 300) when a staying time in each step is optimized in a method of the present invention;

FIG. 7 is a table showing optimized staying times;

DETAILED DESCRIPTION OF THE PREFERRED EMBODIMENTS

Embodiments of the present invention will be explained with reference to accompanying drawings.

Figure 1:
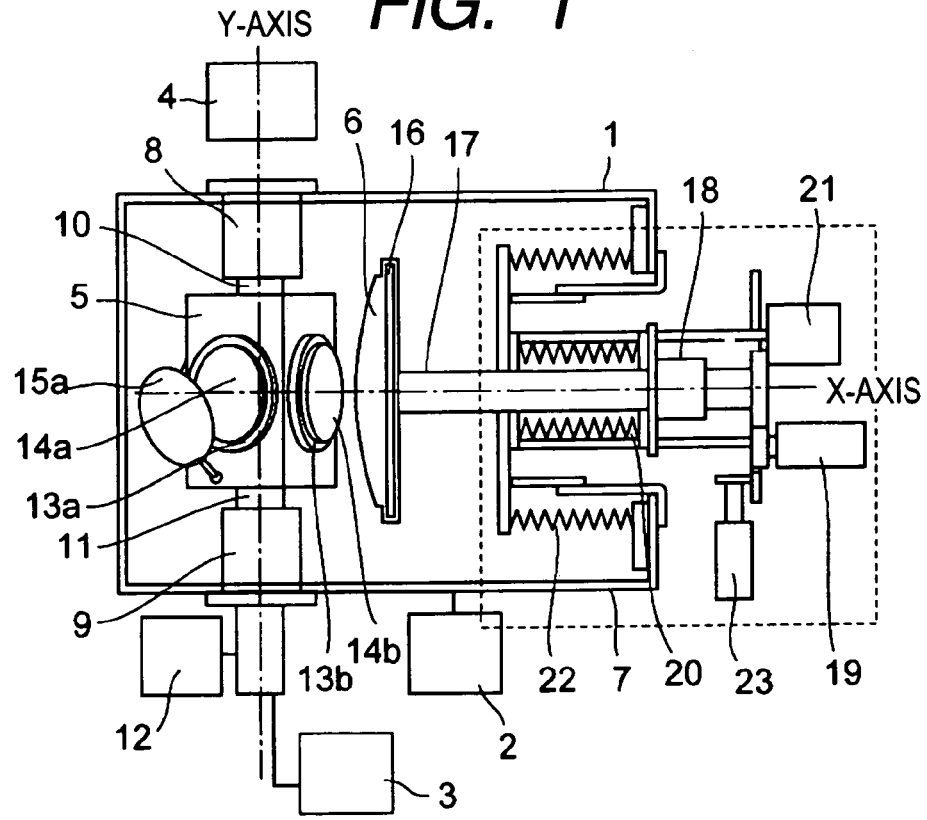
FIG. 1 is a cross-sectional elevation view of a sputtering apparatus embodying the present invention.
Figure 2:
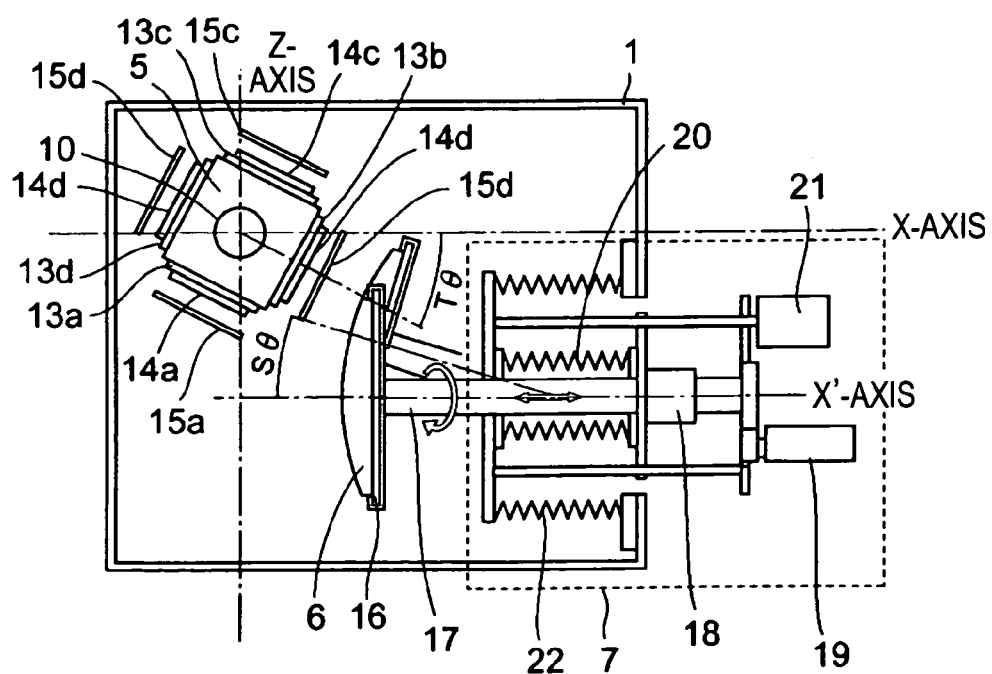
FIG. 2 is a cross-sectional plan view of a sputtering apparatus embodying the present invention.

FIG. 1 is a cross-sectional elevation view of a sputtering apparatus embodying the present invention, and FIG. 2 is a cross-sectional plan view.

A sputtering apparatus of the embodiment shown in FIGS. 1 and 2 is basically constituted of an evacuation system 2 for evacuating a vacuum chamber 1, a gas supply system 3 for supplying sputtering process gases, and a power supply 4 for supplying plural cathodes with a sputtering electric power. The power supply 4 may be provided for each cathode, or may be of a type in which a single power supply is so switched as to supply a cathode to be used with the electric power. In the vacuum changer, there are provided a cathode unit 5 on which plural targets are mounted, and a scan unit 7 for executing a scan operation by rotationally supporting a substrate 6.

More specifically, in the interior of the vacuum chamber, the cathode unit 5 is fixed by cathode rotating axes 10, 11 on upper and lower faces of the chamber 1 across magnetic seals 8, 9, and a cathode drive system 12 is provided under the magnetic seal 9. On lateral faces of the cathode unit 5 of a polygonal pillar shape, there are provided electrically insulated plural cathodes 13a, 13b, 13c, 13d on which targets of different materials 14a, 14b, 14c, 14d are mounted. The cathodes are provided with shutters 15a, 15b, 15c, 15d which can be opened or closed independently. The rotary axes 10, 11 are made hollow, of which interior serves for accommodating a cathode cooling water system, a cable for supplying the sputtering electric power, sputtering gases, a shutter driving air system etc. Such configuration enables a rotational displacement while a sputtering is executed with a desired target. Also by employing a servo motor for the drive motor of the cathode drive system 12, a film formation is made possible under a highly precise positional control.

In the scan unit 7, a substrate holder 16 for supporting the substrate 6 is fixed at an end of a substrate rotary axis 17. The rotary axis 17 is constituted of a substrate rotary drive system 19 for rotating the substrate across a magnetic seal 18, a T-S drive system 21 for varying the target-substrate distance under isolation from the air by T-S bellows 20, and a scan drive system 23 having a rotary center at a center of S$\theta$ bellows 22 capable of a bending motion under isolation from the air and causing a swinging scan motion of the entire unit parallel to the bottom face of the chamber. Such configuration enables a scanned film formation under a substrate rotation during the sputtering and with a variable target-substrate distance. Also, as in the aforementioned cathode drive system, by employing a servo motor for the drive motor of each control axis, a film formation is made possible under a highly precise positional control.

The positional relationship of the units in the chamber, taking the rotary axis of the cathode unit 7 as a Y-axis and axes passing the center of the targets 14 and parallel to the bottom face of the chamber as X and Z axes, is such that the substrate rotary axis 17 has a rotating axis on an X'-axis offset in the direction of the Z-axis from the X-axis, and the scan axis has a rotary center on the X'-axis and executes a scanning operation of the entire scan unit on the X-Z plane.

Figure 8:
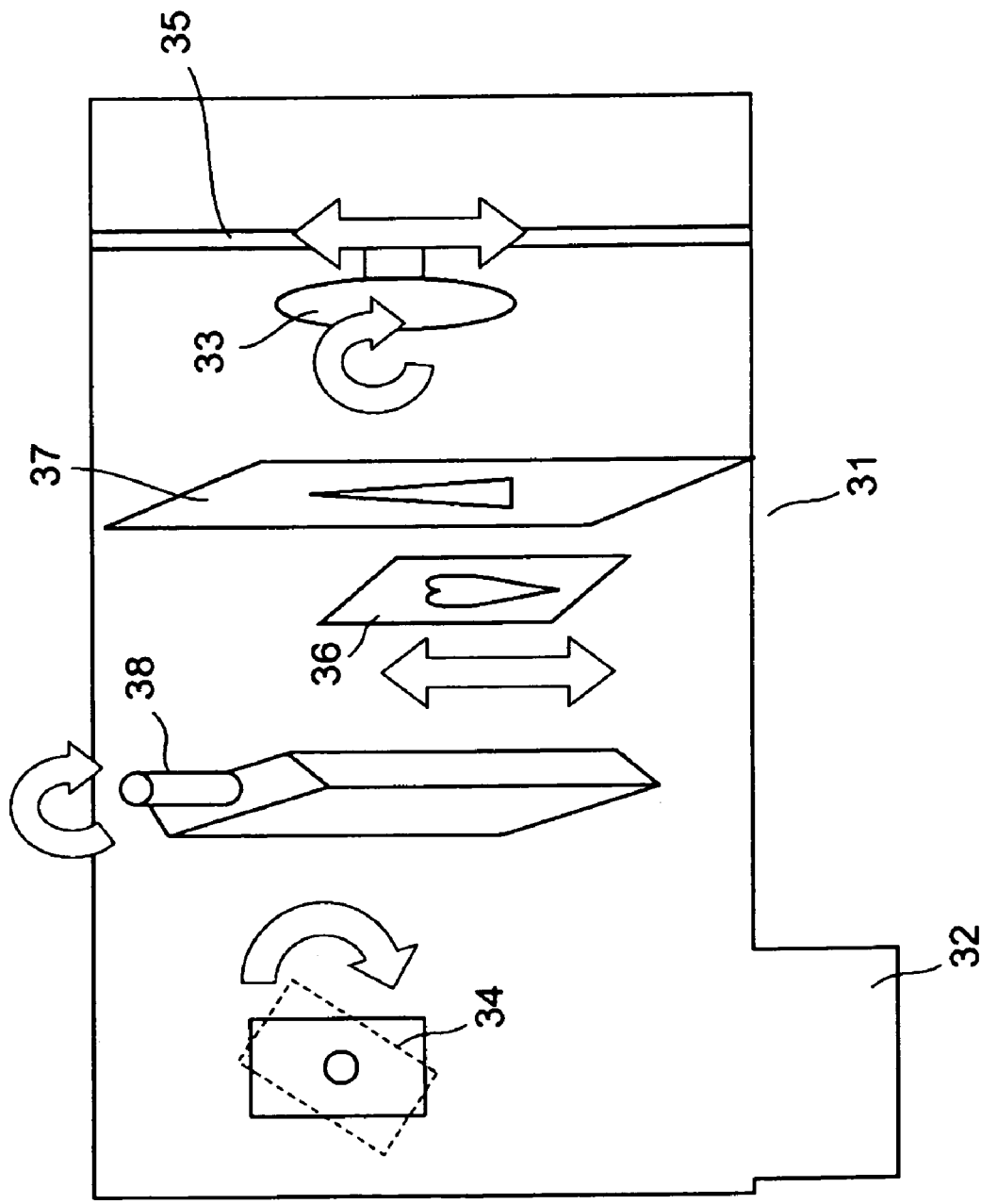
FIG. 8 is a schematic view showing a sputtering apparatus in another embodiment of the present invention.

FIG. 8 is a cross-sectional view of a sputtering apparatus in another embodiment of the present invention.

A sputtering apparatus of the embodiment shown in FIG. 8 is basically constituted of an evacuation system 32 for evacuating a vacuum chamber 31, and a rotating sputtering target 4. A scan unit 35 for rotationally supporting a substrate 3 for executing a scanning thereof is also provided. Between the substrate and the target, there are provided a movable mask 36 and a fixed mask 37 for changing a film forming area, and a collimator 38 for determining a direction and a rate of sputtering particles. The collimator is rendered rotatable, and a change in the angle thereof allows a film forming rate to vary.

The sputtering may be achieved either by an ion beam sputtering utilizing an ion source, or by a magnetron sputtering by supplying an electric power to the target.

EXAMPLES

Example 1

An actual multi-layered film formation by the sputtering apparatus of the present invention is executed in the following procedures:
 setting of scan conditions; and
 optimization of staying time or moving speed in the scan conditions;
 Film formation step:
(1) The setting of the scan conditions can be executed either by a method, based on a CAD plan drawing of the present sputtering apparatus, of determining a target angle T$\theta$, a T-S distance and a scan axis angle S$\theta$ of each step conditions, or by a method of a programmed determination of T$\theta$ and S$\theta$ conditions by an optimizing calculation of maintaining a constant T-S distance and minimizing an angle $\sin(t\theta)^2+\sin(s\theta)^2$, between the center of the target and a normal at each crossing point of lines connecting each step on the substrate. In the following, there will be explained a method based on the CAD drawing.

At first, on the CAD drawing, a radial direction of a dimension larger by about 20% than the radius of the lens mounted on the substrate holder is divided into 10 to 20 divisions, and such divided points are taken as P0, P1, P2, . . . , P20 from the lens center. Then, while the T-S distance between the center of the target and P0, P1, P2, . . . , P20 on the lens surface is kept constant at a distance of 100 mm, each target angle T$\theta$ and each scan axis angle S$\theta$ are determined in such a manner that the normals to the lens surface at P0, P1, P2, . . . , P20 and the normal at the target center substantially coincide.

(2) A simulation for the film thickness distribution is executed with the conditions of the target angle T$\theta$, the T-S distance and the scan axis angle S$\theta$ for each point determined in (1) to calculate a film thickness distribution of each target material. Then a staying time is optimized by a least square method in such a manner that a sum of the calculated film thickness distribution for each point multiplied by the staying time becomes a desired film thickness distribution.

(3) In the film forming step, based on the film forming rate of each target material under the optimized condition, a staying time in each point is inputted into the sputtering apparatus so as to obtain the desired film thickness. Then a lens of an optimized shape is mounted on the substrate holder and is set in the scan unit of the vacuum chamber, through the load lock chamber.

After the interior of the vacuum chamber is sufficiently evacuated with the evacuating unit, the film formation is initiated with the target angle T$\theta$, the T-S distance, the scan axis angle S$\theta$ and the staying time, optimized for each point.

After the film formation, the substrate is taken out and is subjected to a film thickness measurement, and in case a desired film thickness distribution is not obtained, a desired film thickness distribution can be easily obtained by optimizing the staying time corresponding to an observed error.

Example 2

An effect similar to that in the example 1 can also be obtained, in a configuration similar to that of the example 1, under a condition setting by continuously varying the changing speed of the target angle T$\theta$, the T-S distance and the scan axis angle S$\theta$ based on optimum conditions providing a desired film thickness distribution, obtained by the result of a film thickness simulation for each step.

Then, for comparing with the film thickness distribution control on an irregular substrate, a comparative simulation was made on the method of film formation under a movement of the substrate in X or XY direction parallel to the evaporation source (Japanese Patent Application Laid-Open No. H9-213634) and the method of the present invention under the control of the target angle Tθ, the T-S distance and the scan axis angle Sθ.

There were assumed conditions of a target of a diameter of 5 inches, a T-S distance of 100, 120 or 150 mm, movements of 16 steps with a pitch of 15 mm in the radial direction from the center of the substrate, a convex-shaped substrate of an external diameter of 300 mm and a radius of curvature of 300 mm in a rotating motion, and a film forming pressure of a discharge maintaining limit of about 0.1 Pa where the influence of scattering becomes low, and the scattering effect was disregarded. Also the emission angle distribution was calculated according to a cosine rule.

Figure 3:
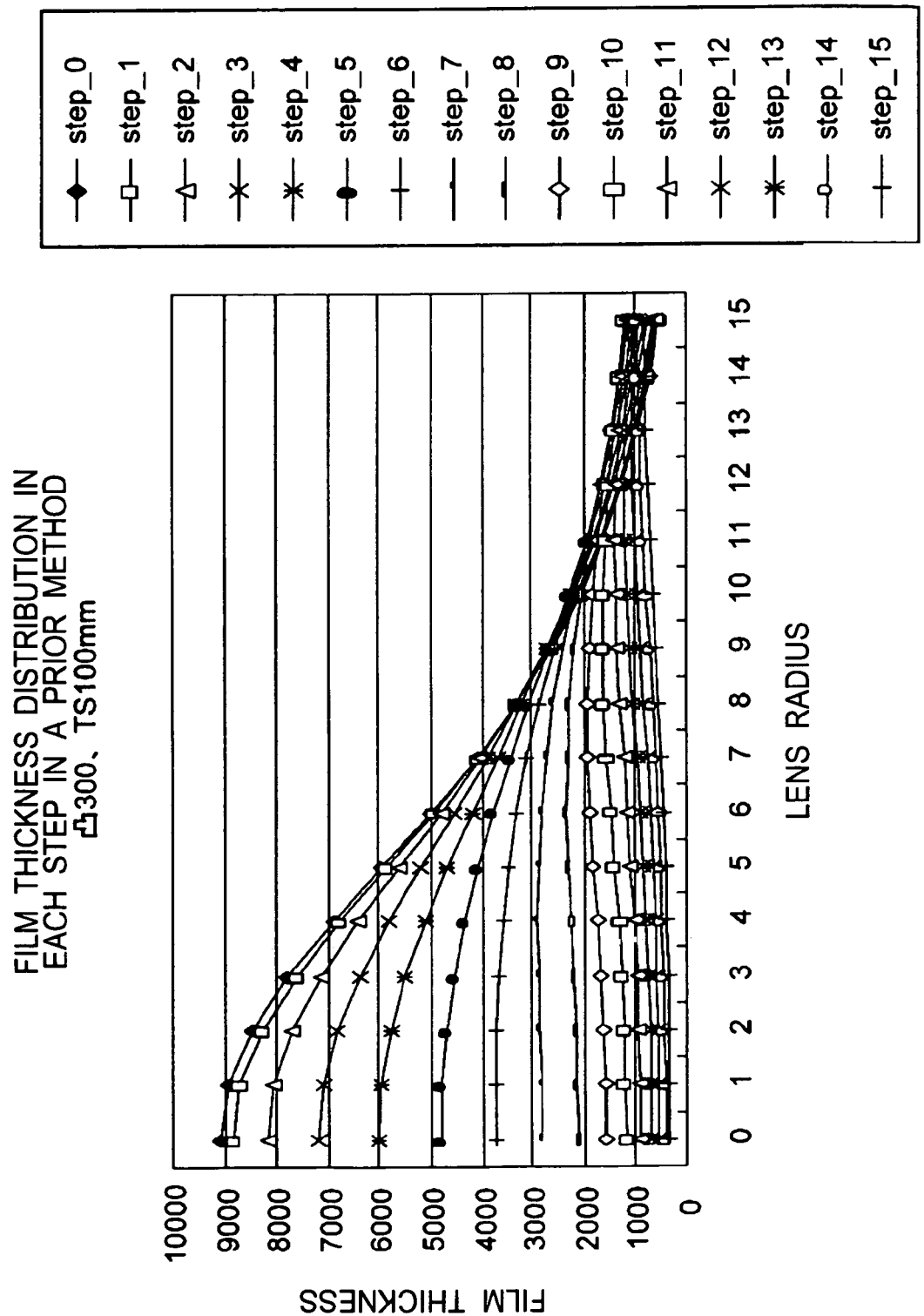
FIG. 3 is a chart showing a film thickness distribution (a convex lens, ø300, radius of curvature 300) in each step of a prior method.
Figure 4:
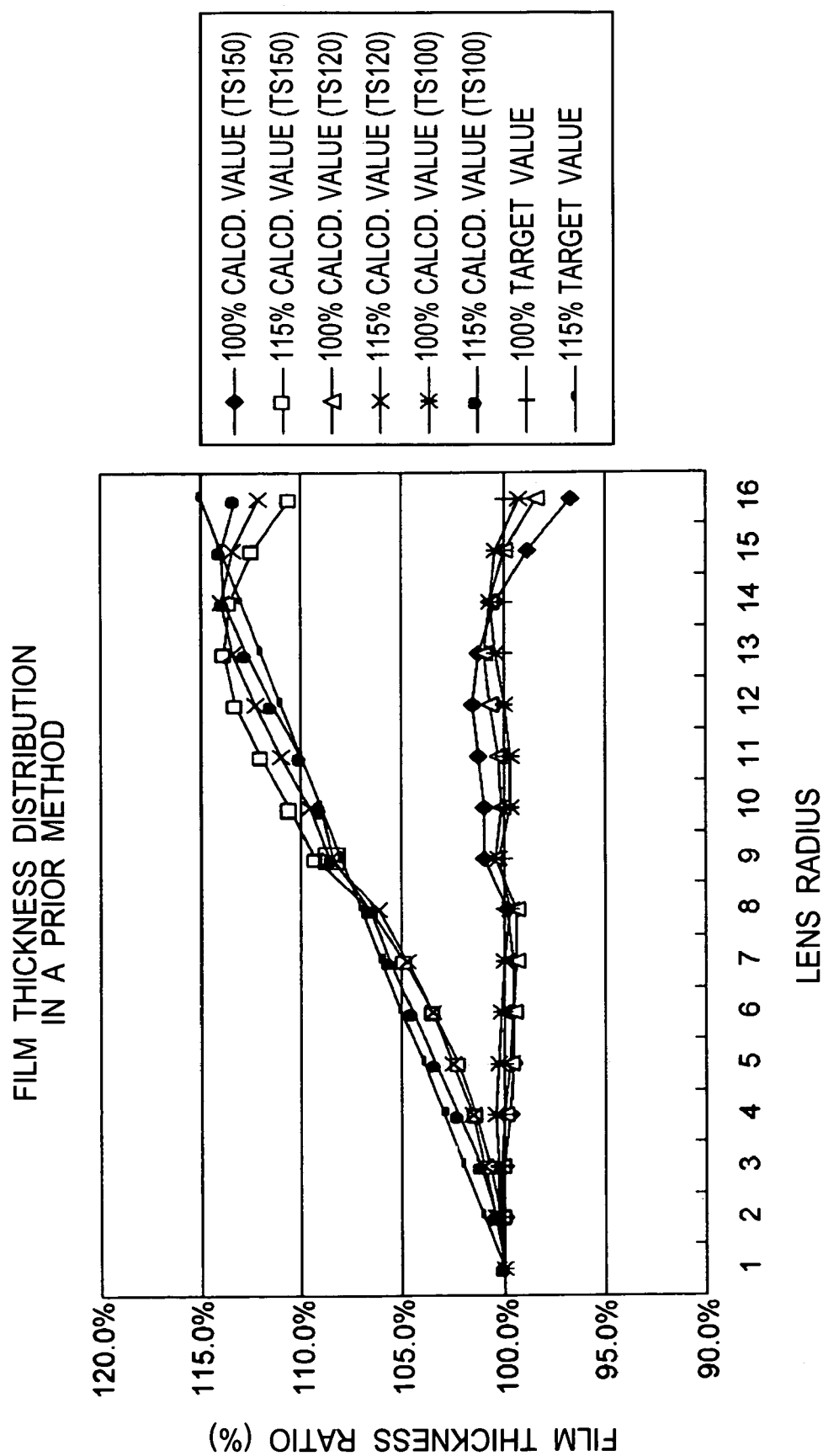
FIG. 4 is a chart showing a film thickness distribution (a convex lens, ø300, radius of curvature 300) when a staying time in each step is optimized in a prior method.

FIG. 3 shows a film thickness distribution in each step of the prior method, in case the aforementioned convex lens is moved by 16 steps with a pitch of 15 mm in the X-direction parallel to the evaporation source. FIG. 4 shows film thickness distributions, obtained by optimizing the staying time in such a manner that a sum of a product of a film thickness distribution and a film forming rate multiplied by a staying time in each step becomes a desired value of 100% (an entirely uniform film thickness distribution) or 115% (film thickness linearly increasing to 115% from the lens center to the periphery).

FIG. 5 shows a film thickness distribution of each step simulated in the configuration of the present invention, and, though the basic conditions are same as before, the target angle Tθ, the scan axis angle Sθ and the T-S distance were determined from a CAD drawing. A radial direction of the lens was divided into 16 divisions, and such divided points are taken as P0, P1, P2, . . . , P15 from the lens center. Then, the T-S distance was kept constant at a distance of 100, 120 or 150 mm, and each target angle Tθ and each scan axis angle Sθ were determined in such a manner that the normals to the lens surface at P0, P1, P2, . . . , P10 and the normal at the target center substantially coincide.

FIG. 6 shows film thickness distributions, obtained by optimizing the staying time in such a manner that a sum of a product of a film thickness distribution and a film forming rate multiplied by a staying time in each step in FIG. 5 becomes a desired value of 100% (an entirely uniform film thickness distribution) or 115% (film thickness linearly increasing to 115% from the lens center to the periphery).

FIG. 7 shows a table in which the staying time in each step is represented by a percentage with respect to the entire staying time. As being apparent from FIGS. 3, 5 and 7, in the prior method, the film in a peripheral portion of the lens becomes thinner because of an increase in an inclined entry component of the sputtering particles into the substrate and an increase in the T-S distance, whereby a staying ratio increases in the film formation of the peripheral portion and the film thickness uniformity is inferior to the present invention because the film formation takes place simultaneously also in a central portion of a smaller area. In the present invention, it is further preferable to provide a hollow cylindrical chimney in front of the target, thereby further removing an inclined entry component and achieving a further improvement in the film thickness distribution and in the uniformity of film quality.

Example 3

Figure 9:
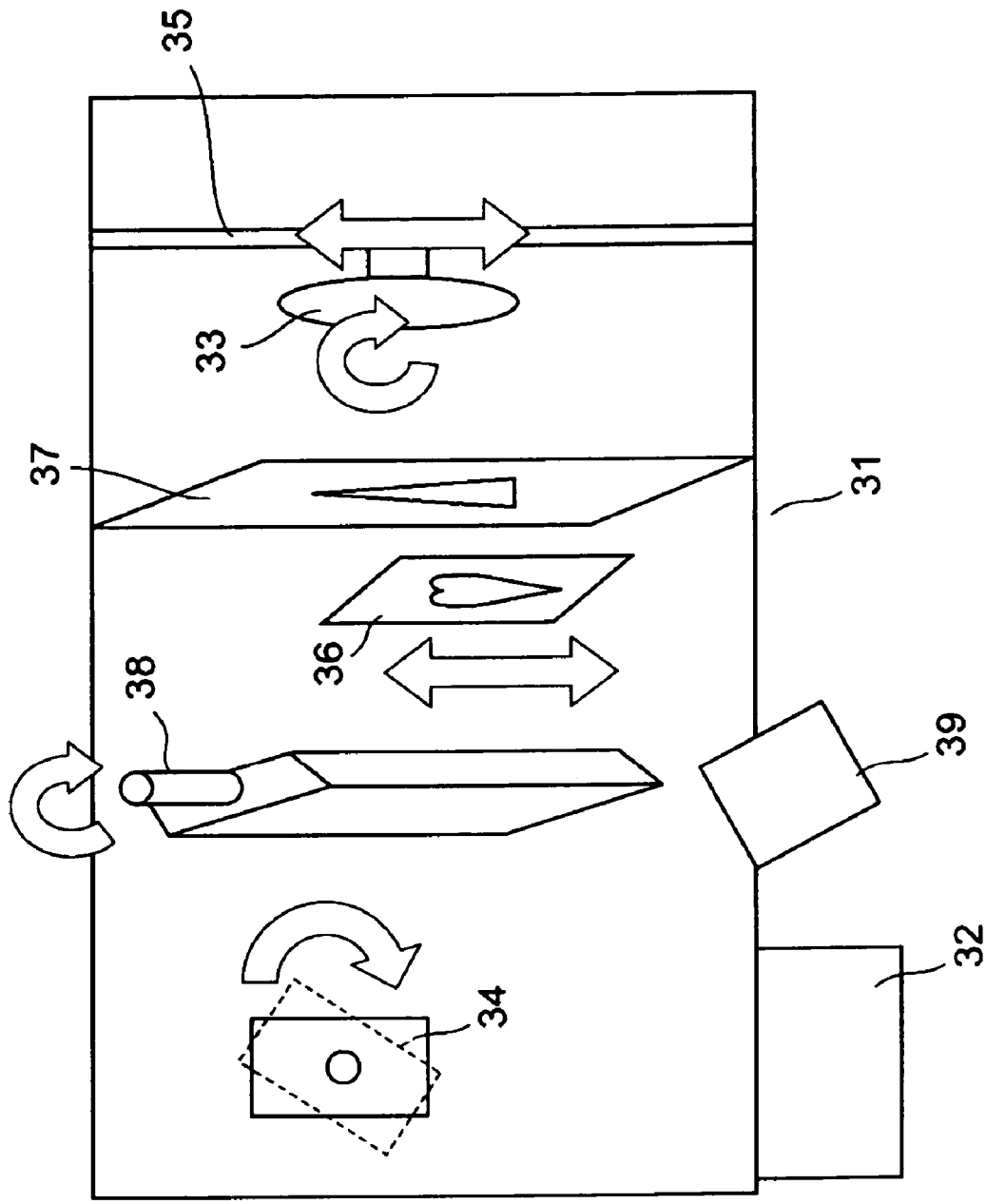
FIG. 9 is a schematic view showing a sputtering apparatus in an embodiment 3 of the present invention.

FIG. 9 shows an apparatus of the present embodiment.

The sputtering apparatus shown in FIG. 9 is basically constituted of an evacuation system 32 for evacuating a vacuum chamber 31, and a rotating sputtering target 34. A scan unit 35 for rotationally supporting a substrate 33 for executing a scanning thereof is also provided. Between the substrate and the target, there are provided a movable mask 36 and a fixed mask 37 for changing a film forming area, and a collimator 38 for determining a direction and a rate of sputtering particles. The collimator is rendered rotatable, and a change in the angle thereof allows a film forming rate to vary. The sputtering is executed by an ion beam sputtering utilizing an ion source 39.

A film forming procedure with this apparatus is as follows.

The substrate 33 is introduced into the vacuum chamber 31, and waits until a pressure equal to or lower than $10^{-4}$ Pa is reached, then the film formation is initiated by rotating the substrate 33 and setting the ion beam 39 and the target 34 at desired angles. In this operation, the scan unit and the movable mask 36 are moved to control the film thickness distribution on the substrate 33. Also the film forming rate is controlled by the collimator 38 to improve the uniformity.

With this apparatus, a desired film thickness could be obtained with a precision within ±0.2%.

Example 4

Figure 10:
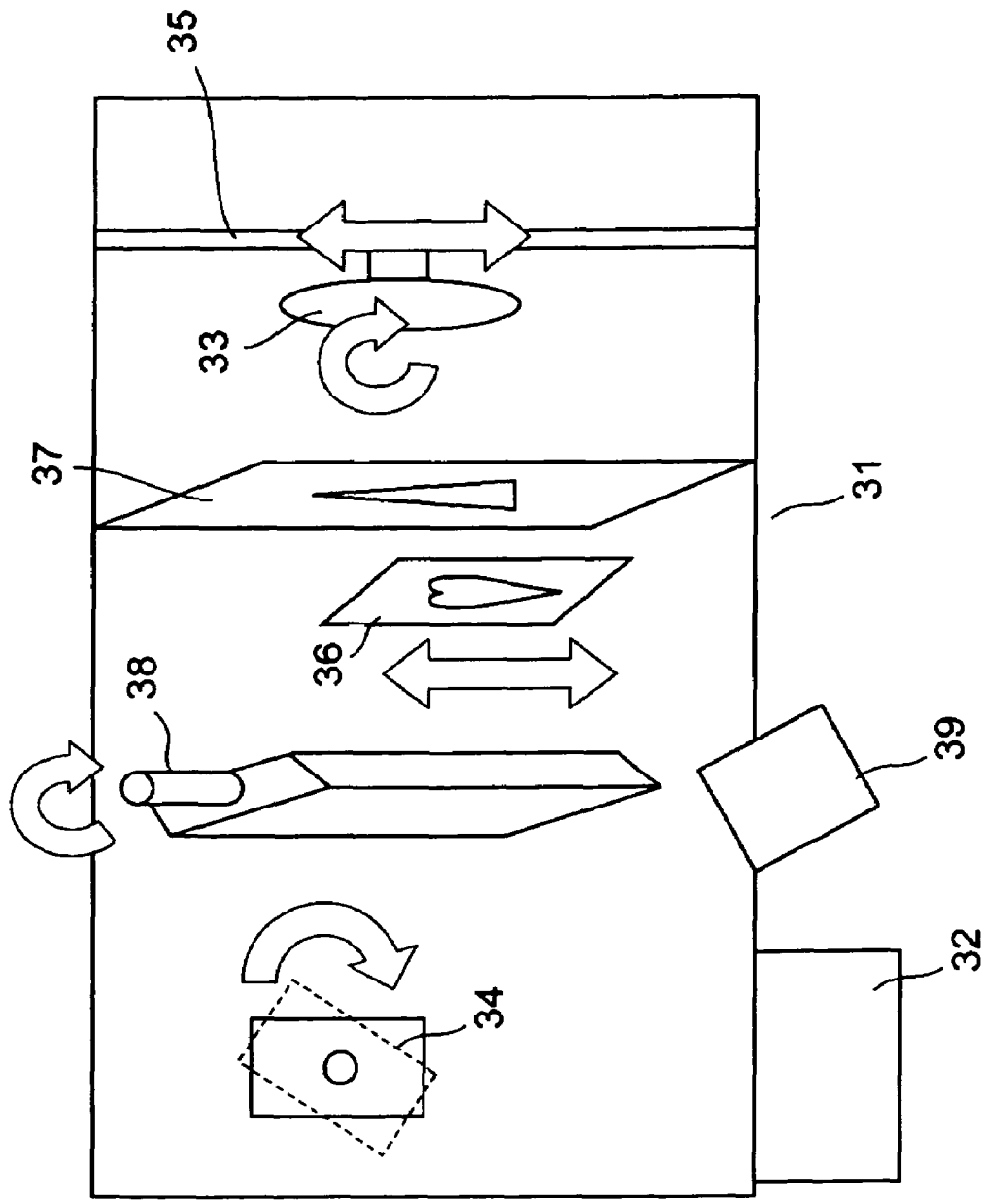
FIG. 10 is a schematic view showing a sputtering apparatus in an embodiment 4 of the present invention.

FIG. 10 shows an apparatus of the present embodiment.

The sputtering apparatus shown in FIG. 10 is basically constituted of an evacuation system 32 for evacuating a vacuum chamber 31, and a rotating sputtering target 34. A scan unit 35 for rotationally supporting a substrate 33 having a rotational parabolic surface and for executing a scanning thereof is also provided. Between the substrate and the target, there are provided movable masks 36, 40 and a fixed mask 37 for changing a film forming area, and a collimator 38 for determining a direction and a rate of sputtering particles. The collimator is rendered rotatable, and a change in the angle thereof allows a film forming rate to vary. The sputtering is executed by an ion beam sputtering utilizing an ion source 39.

A film forming procedure with this apparatus is as follows.

The substrate 33 is introduced into the vacuum chamber 31, and waits until a pressure equal to or lower than $10^{-4}$ Pa is reached. Then the film formation is initiated by rotating the substrate 33 and setting the ion beam 39 and the target 34 at desired angles. In this operation, the scan unit and the movable masks 36, 40 are moved to control the film thickness distribution on the substrate 33. Also the film forming rate is controlled by the collimator 38 to improve the uniformity.

With this apparatus, a desired film thickness could be obtained with a precision within ±0.2%.

In a film forming process employing, as a substrate, a high-performance optical component having an irregular shape such as a lens, a step-scan operation under a continuous control or a staying-time control with a scan speed control on a partial film forming area, principally subjected to a vertical entry component of sputtering particles obtained by optimizing a target angle Tθ and a scan axis angle Sθ in each step, allows a uniform film of a high film density to be formed on the lens surface, achieving an efficient film formation of an antireflection film and the like with a desired film thickness distribution.

Also in a film forming process employing, as a substrate, a high-performance optical component having various shapes such as a lens or a mirror, the addition of a function capable of varying a rate and/or a film forming area in the course of film formation allows an efficient film formation with a desired film thickness distribution to be realized.

What is claimed is:

1. A sputtering apparatus for forming a film on a substrate by physical gas-phase growth comprising:
   (a) a vacuum chamber;
   (b) a cathode unit holding a target set inside the vacuum chamber and provided with a revolving mechanism for controllably revolving the target opposite to the substrate; and
   (c) a substrate-holding unit inside the vacuum chamber to support the substrate facing the target,
   wherein the substrate-holding unit has a substrate rotary drive system having a rotating axis for rotating the substrate and a scan drive system having a swing scan axis which is the same as the rotating axis for executing swing scanning of the substrate around the axis of the substrate and wherein the cathode unit revolves and the substrate-holding unit rotates and executes swing scanning to support the substrate facing the target such that a line perpendicular to the surface of the substrate is maintained perpendicular to the surface of the target while sputtering is executed.

2. A sputtering apparatus according to claim 1, wherein the cathode unit holds plural targets and is provided with a revolving mechanism for controllably revolving the target opposite to the substrate.

3. A sputtering apparatus according to claim 2, wherein a rotary axis of the substrate is in the X-axis direction, a revolving axis of the cathode unit is in the Y-axis direction, and the rotary axis of the substrate and the revolving axis of the cathode unit are offset in the Z-axis direction.

4. A sputtering apparatus according to claim 3, wherein the substrate-holding unit has a T-S drive system for moving the substrate in the X-axis direction to adjust a distance between the substrate and the target.

5. A sputtering apparatus according to claim 2, wherein an adjusting mechanism for rendering a film-forming rate and a film-forming area variable is spaced between the cathode unit and the substrate-holding unit.

6. A sputtering apparatus according to claim 5, wherein the adjusting mechanism is a movable mask.

7. A sputtering apparatus according to claim 5, wherein the adjusting mechanism is a collimator capable of changing its angle.

8. A method for forming a film on a substrate by physical gas-phase growth with a sputtering apparatus having a vacuum chamber, a cathode unit holding a target inside the vacuum chamber and provided with a revolving mechanism for controllably revolving the target and a substrate-holding unit inside the vacuum chamber, comprising:
   (a) supporting the substrate with the substrate-holding unit having a substrate rotary drive system for rotating the substrate and a scan drive system for executing swing scanning of the substrate;
   (b) supplying sputtering gases to the vacuum chamber; and
   (c) sputtering the target to form a film on the substrate, wherein the cathode unit rotates, and the substrate-holding unit rotates and executes swing scanning to support the substrate facing the target such that a line perpendicular to the surface of the substrate is maintained perpendicular to the film-forming face of the target while sputtering is conducted.

* * * * *